(12) United States Patent
Tsai et al.

(10) Patent No.: US 11,670,596 B2
(45) Date of Patent: Jun. 6, 2023

(54) SEMICONDUCTOR PACKAGE STRUCTURE

(71) Applicant: MEDIATEK INC., Hsinchu (TW)

(72) Inventors: Yi-Lin Tsai, Hsinchu (TW); Wen-Sung Hsu, Hsinchu (TW); I-Hsuan Peng, Hsinchu (TW); Yi-Jou Lin, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 17/208,175

(22) Filed: Mar. 22, 2021

(65) Prior Publication Data

US 2021/0313271 A1 Oct. 7, 2021

Related U.S. Application Data

(60) Provisional application No. 63/006,144, filed on Apr. 7, 2020.

(51) Int. Cl.
| | |
|---|---|
| *H01L 23/538* | (2006.01) |
| *H01L 23/498* | (2006.01) |
| *H01L 23/00* | (2006.01) |

(52) U.S. Cl.
CPC .... *H01L 23/5381* (2013.01); *H01L 23/49816* (2013.01); *H01L 24/20* (2013.01);
(Continued)

(58) Field of Classification Search
CPC ... H01L 24/20; H01L 24/73; H01L 2224/224; H01L 2224/73104
See application file for complete search history.

(56) References Cited

U.S. PATENT DOCUMENTS 10,319,690 B2 6/2019 Liao et al.
10,510,631 B2 12/2019 Tai et al.
(Continued)

FOREIGN PATENT DOCUMENTS

TW 201714260 A 4/2017
TW 201801279 A 1/2018
(Continued)

OTHER PUBLICATIONS

Chinese language office action dated Jul. 29, 2021, issued in application No. TW 109140056.
(Continued)

*Primary Examiner* — Jasmine J Clark
(74) *Attorney, Agent, or Firm* — McClure, Qualey & Rodack, LLP

(57) ABSTRACT

A semiconductor package structure includes a substrate, a first redistribution layer, a second redistribution layer, a bridge structure, a first semiconductor component, and a second semiconductor component. The first redistribution layer is over the substrate. The second redistribution layer is over the first redistribution layer. The bridge structure is between the first redistribution layer and the second redistribution layer, wherein the bridge structure includes an active device. The first semiconductor component and the second semiconductor component are located over the second redistribution layer, wherein the first semiconductor component is electrically coupled to the second semiconductor component through the second redistribution layer and the bridge structure.

20 Claims, 3 Drawing Sheets

(52) U.S. Cl.
CPC ........ *H01L 24/73* (2013.01); *H01L 2224/224* (2013.01); *H01L 2224/73104* (2013.01)

(56) References Cited

U.S. PATENT DOCUMENTS

| | | |
|---|---|---|
| 10,763,241 B2 | 9/2020 | Tan |
| 10,770,655 B2 | 9/2020 | Yu et al. |
| 10,847,869 B2 | 11/2020 | Han et al. |
| 2010/0252304 A1 | 10/2010 | Muramatsu et al. |
| 2014/0048928 A1 | 2/2014 | Li et al. |
| 2016/0056102 A1 | 2/2016 | Konchady et al. |
| 2020/0212006 A1* | 7/2020 | Chang .................... H01L 25/50 |
| 2020/0243450 A1 | 7/2020 | Cho et al. |
| 2021/0020574 A1 | 1/2021 | Yu et al. |

FOREIGN PATENT DOCUMENTS

| | | |
|---|---|---|
| TW | 201839917 A | 11/2018 |
| TW | 201903994 A | 1/2019 |
| TW | 201916305 A | 4/2019 |
| WO | 2019/132965 A1 | 7/2019 |

OTHER PUBLICATIONS

Chinese language office action dated Sep. 3, 2021, issued in application No. TW 110112117.

Office Action dated Mar. 1, 2022 of its related U.S. Appl. No. 17/098,659.

Final Office Action dated Sep. 1, 2022, issued in U.S. Appl. No. 17/098,659.

German language office action dated Oct. 27, 2022, issued in application No. 10 2020 130 699.7.

\* cited by examiner

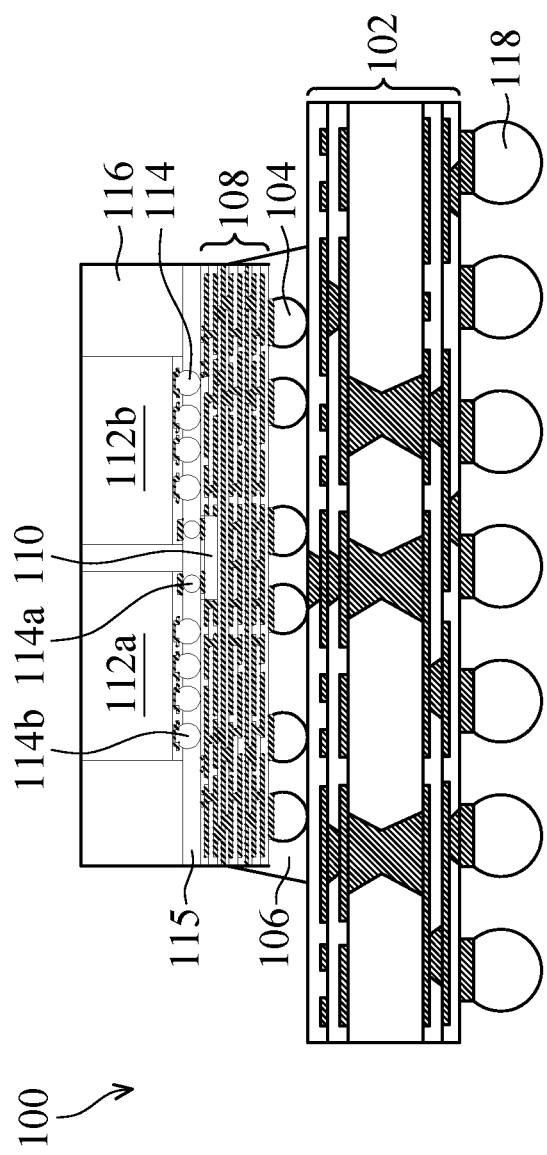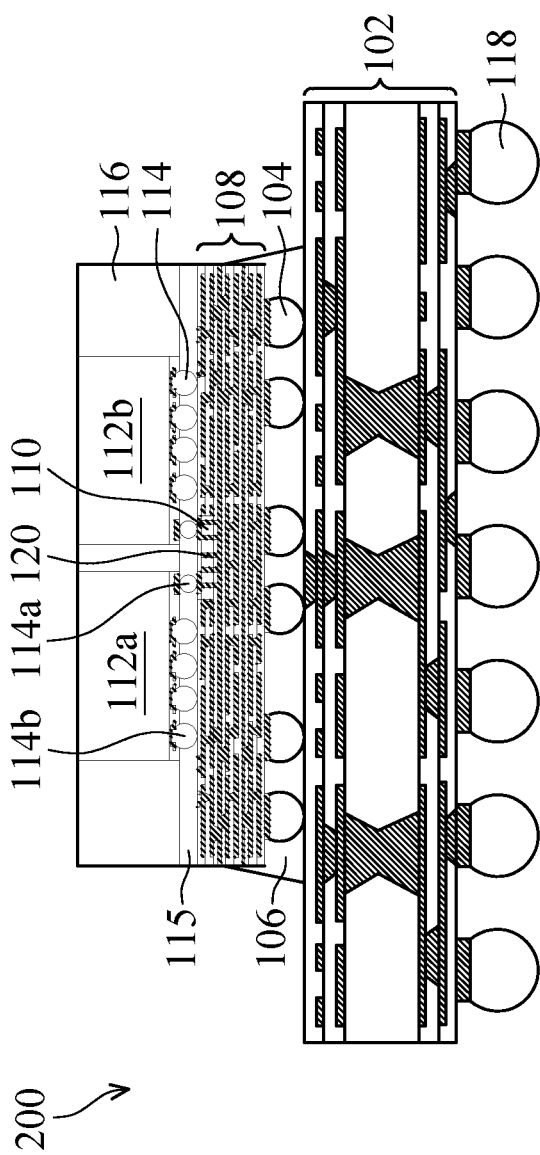

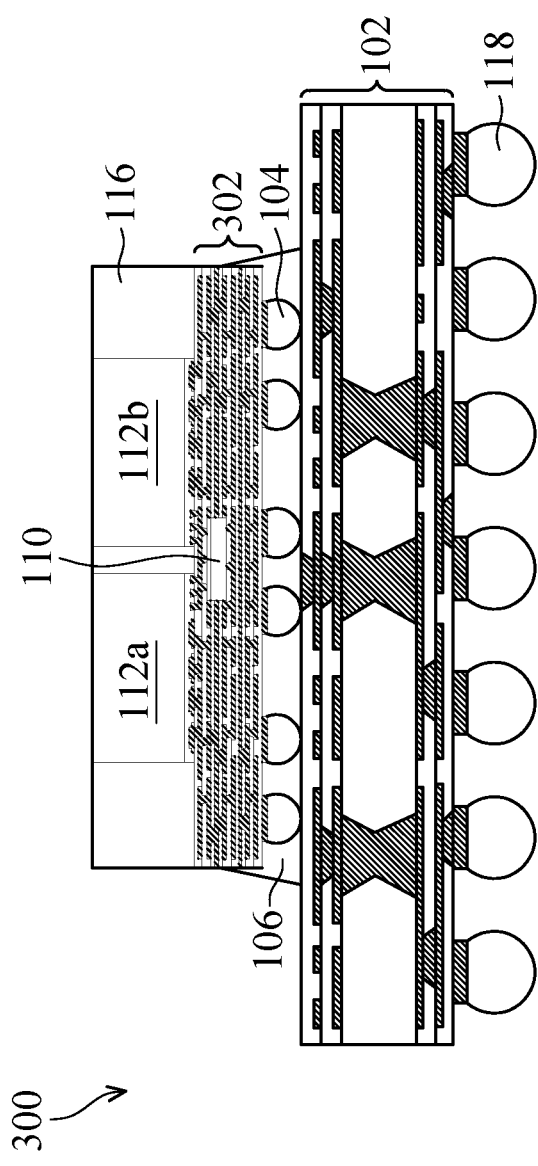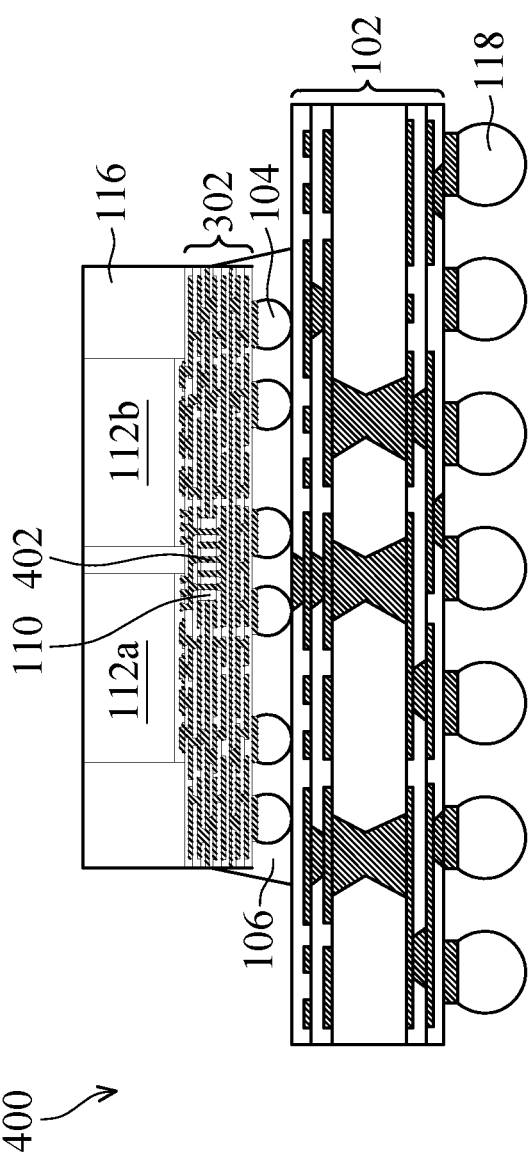

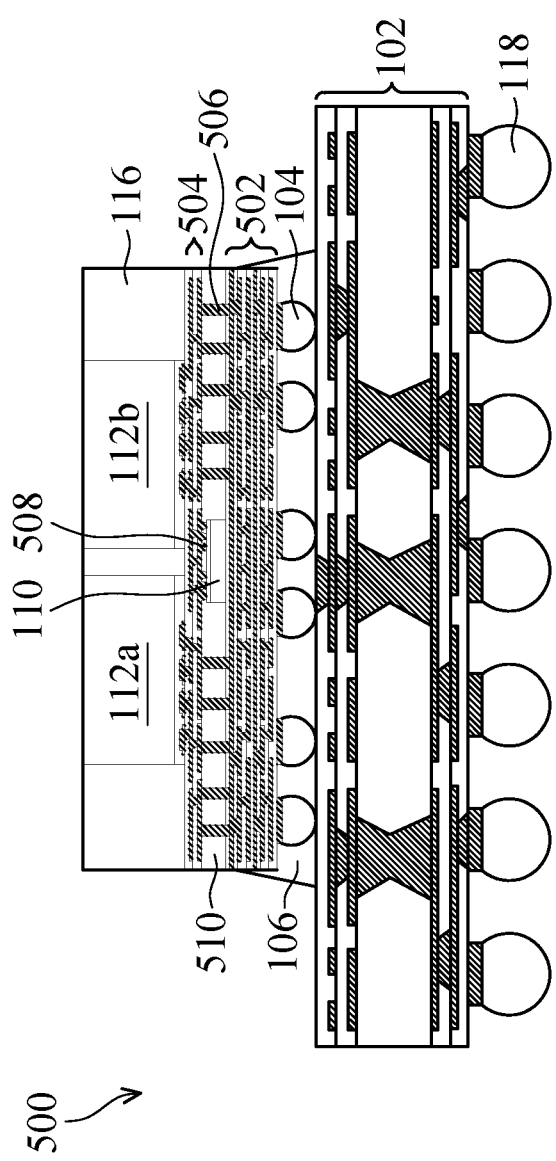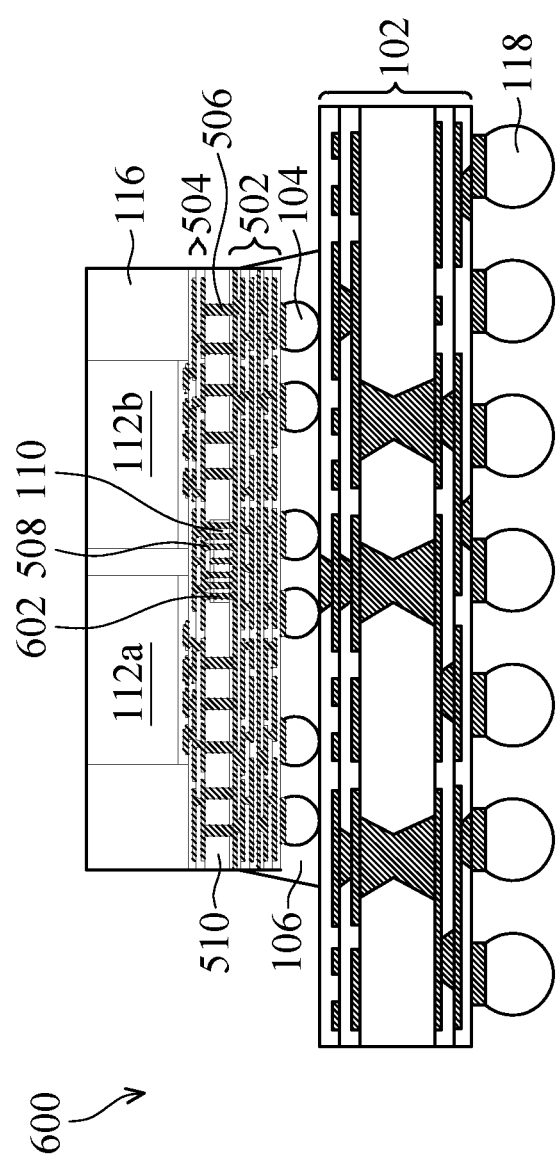

SEMICONDUCTOR PACKAGE STRUCTURE

CROSS REFERENCE TO RELATED APPLICATIONS

This application claims the benefit of U.S. Provisional Application No. 63/006,144 filed on Apr. 7, 2020, the entirety of which is incorporated by reference herein.

BACKGROUND OF THE INVENTION

Field of the Invention

The present invention relates to semiconductor packaging technology, and in particular to a semiconductor package structure.

Description of the Related Art

A smaller package structure that take up less space than the previous generation of package structures is required. One technological solution is heterogeneous integration, which is to integrate multiple semiconductor dies within the same package. As such, manufacturing costs can be reduced while still being able to provide high performance and high density. In some package structures, an interposer or a bridge structure may be utilized to provide interconnections between the semiconductor dies.

Although existing semiconductor package structures are generally adequate for their intended purposes, they are not satisfactory in all respects. For example, the cost of the interposer and the cost of the substrate with a bridge structure embedded therein are relatively high. Therefore, there is a need to further improve the semiconductor package structure to reduce production costs and increase the yield.

BRIEF SUMMARY OF THE INVENTION

Semiconductor package structures are provided. An exemplary embodiment of a semiconductor package structure includes a substrate, a first redistribution layer, a second redistribution layer, a bridge structure, a first semiconductor component and a second semiconductor component. The first redistribution layer is over the substrate. The second redistribution layer is over the first redistribution layer. The bridge structure is between the first redistribution layer and the second redistribution layer, wherein the bridge structure includes an active device. The first semiconductor component and the second semiconductor component are located over the second redistribution layer, wherein the first semiconductor component is electrically coupled to the second semiconductor component through the second redistribution layer and the bridge structure.

Another exemplary embodiment of a semiconductor package structure includes a substrate, a redistribution layer, a bridge structure, a first semiconductor component and a second semiconductor component. The redistribution layer is over the substrate. The bridge structure is in the redistribution layer and includes an active device, wherein the bridge structure has a plurality of through vias which are electrically coupled to the redistribution layer. The first semiconductor component and the second semiconductor component are located over the redistribution layer, wherein the first semiconductor component is electrically coupled to the second semiconductor component through the redistribution layer and the bridge structure.

Yet another exemplary embodiment of a semiconductor package structure includes a substrate, a redistribution layer, a bridge structure, a plurality of conductive structures, a first semiconductor component and a second semiconductor component. The redistribution layer is over the substrate. The bridge structure is in the redistribution layer and includes an active device. The conductive structures are located over the redistribution layer. The first semiconductor component and the second semiconductor component are located over the conductive structures, wherein the first semiconductor component is electrically coupled to the second semiconductor component through the conductive structures, the redistribution layer, and the bridge structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 1-6 are cross-sectional views of semiconductor package structures in accordance with some embodiments.

DETAILED DESCRIPTION OF THE INVENTION

The following description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Semiconductor package structures are described in accordance with some embodiments of the present disclosure. The semiconductor package structure includes a bridge structure which includes an active device over a substrate, so that an interconnection between semiconductor components and an interconnection between the semiconductor component and the bridge structure can be provided.

FIG. 1 is a cross-sectional view of a semiconductor package structure 100 in accordance with some embodiments. Additional features can be added to the semiconductor package structure 100. Some of the features described below can be replaced or eliminated for different embodiments. To simplify the diagram, only a portion of the semiconductor package structure 100 are illustrated.

As shown in FIG. 1, the semiconductor package structure 100 includes a substrate 102, in accordance with some embodiments. In some embodiments, the substrate 102 includes an insulating core, such as a fiberglass reinforced resin core, to prevent the substrate 102 from warpage. The substrate 102 may have a wiring structure therein. In some embodiments, the wiring structure of the substrate 102 includes conductive layers, conductive vias, conductive pillars, the like, or a combination thereof. The wiring structure of the substrate 102 may be formed of metal, such as copper, aluminum, the like, or a combination thereof.

The wiring structure of the substrate 102 may be disposed in inter-metal dielectric (IMD) layers. In some embodiments, the IMD layers may be formed of organic materials, such as a polymer base material, an non-organic material, such as silicon nitride, silicon oxide, silicon oxynitride, the like, or a combination thereof. It should be noted that the configuration of the substrate 102 shown in the figures is exemplary only and is not intended to limit the present disclosure. Any desired semiconductor element may be formed in and on the substrate 102. However, in order to simplify the diagram, only the flat substrate 102 is illustrated.

In some embodiments, the semiconductor package structure 100 includes a redistribution layer 108 with a bridge structure 110 embedded therein. The redistribution layer 108 may be bonded onto the carrier substrate 102 through a plurality of conductive structures 104. The conductive structures 104 may be formed between the redistribution layer 108 and the substrates 102, and may electrically couple the redistribution layer 108 to the substrates 102. In some embodiments, the conductive structures 104 include conductive materials, such as metal. The conductive structures 104 may be microbumps, controlled collapse chip connection (C4) bumps, ball grid array (BGA) balls, the like, or a combination thereof.

The conductive structures 104 may be surrounded by an underfill material 106. In some embodiments, the underfill material 106 is between the substrates 102 and the redistribution layer 108, and fills in gaps between the conductive structures 104 to provide structural support. In some embodiments, the underfill material 106 may be dispensed with capillary force after the conductive structures 104 are formed between the substrates 102 and the redistribution layer 108. Then, the underfill material 106 may be cured using a suitable curing process, such as a thermal cure process, a ultra-violet (UV) cure process, or the like. The underfill material 106 may be formed of polymer, such as epoxy.

As shown in FIG. 1, the underfill material 106 may cover a portion of the top surface of the substrate 102, and another portion of the top surface of the substrate 102 may be exposed. The underfill material 106 may extend to a sidewall of the redistribution layer 108, and may cover a portion of the sidewall of the redistribution layer 108.

The redistribution layer 108 may include one or more metal layers and passivation layers, wherein the one or more metal layers may be disposed in the one or more passivation layers. In some embodiments, the passivation layers are formed of silicon nitride, silicon carbide, silicon oxide, the like, or a combination thereof.

In some embodiments, the bridge structure 110 is formed during the formation of the redistribution layer 108. The bridge structure 110 may provide an interconnection between semiconductor components and provide an interconnection between the semiconductor components and the bridge structure 110.

In some other embodiments, in order to achieve interconnections between semiconductor components, the substrate may be formed to have a bridge structure therein. However, some associated problems are also introduced. For example, the layer count of the substrate should be increased for electrically connecting the bridge structure to the wiring structure of the substrate, result in the difficulty of manufacturing the substrate. In addition, the process for forming the semiconductor package structure may be restricted by the manufacture of the substrate.

Therefore, in comparison with providing a substrate with a bridge structure formed therein, providing the bridge structure 110 over the substrate 102, such as in the redistribution layer 108, according to some embodiments of the present disclosure can reduce the layer count of the substrate 102. The difficulty of manufacturing the substrate 102 can be reduced. As a result, the fabrication yield of the substrate 102 can be improved, and the cost of the substrate 102 can be reduced as well. Furthermore, since the formation of the substrate 102 without a bridge structure therein is well-developed, flexible processes may be used to form the semiconductor package structure 100 instead of being limited by the manufacture of the substrate 102.

The bridge structure 110 may include silicon bridges. In some embodiments, the bridge structure 110 includes active components. For example, the bridge structure 110 may be a system-on-chip (SoC) device, a logic device, a memory device, a radio frequency (RF) device, the like, or any combination thereof. For example, the bridge structure 110 may include a microcontroller (MCU), a microprocessor (MPU), a power management integrated circuit (PMIC), a global positioning system (GPS) device, a central processing unit (CPU), a graphics processing unit (GPU), a dynamic random access memory (DRAM) controller, a static random-access memory (SRAM), a high bandwidth memory (HBM), the like, or any combination thereof. In some other embodiments, the bridge structure 110 includes interconnecting structures and one or more active components or passive components, such as resistors, capacitors, inductors, or the like.

According to some embodiments of the present disclosure, the bridge structure 110 including active components can realize three-dimensional integrated circuit (3D IC) stacking, and can be more flexible than chip-on-chip or wafer-on-wafer technologies. In addition, the bridge structure 110 can minimize the signal path to increase the processing speed and provide low power and low latency.

The bridge structure 110 may have a different line width/space (L/S) than the redistribution layer 108. For example, the L/S of the bridge structure 110 may be finer than the L/S of the redistribution layer 108. In some embodiments, the layer of the redistribution layer 108 which is close to the bridge structure 110 may have a finer L/S than that of the layer the redistribution layer 108 which is far to the bridge structure 110. A flexible routing for high-end devices and multi-function integration can thereby be achieved. The L/S of the redistribution layer no longer acts as a bottleneck in package development. For example, the L/S of the bridge structure 110 may be equal to or less than about 2/2 μm, such as range from about 0.4/0.4 μm to about 2/2 μm. For example, the L/S of the redistribution layer 108 may be equal to or greater than about 2/2 such as range from about 2/2 μm to about 10/10 For example, the L/S of the redistribution layer 108 may be about 5/5 μm and about 2/2 μm for different layers of the redistribution layer 108.

The positions and the numbers of the bridge structure 110 may be adjusted according to the routing of the semiconductor package structure 100. For example, the semiconductor package structure 100 may include two or more bridge structures 110 embedded in redistribution layer 108.

As shown in FIG. 1, a bottom surface and sidewalls of each of the bridge structure 110 may be covered by the redistribution layer 108, while the top surface of the bridge structure 110 may be exposed by the redistribution layer 108. The top surface of the redistribution layer 108 may be substantially coplanar with the top surface of the bridge structure 110, but the present disclosure is not limited thereto. For example, the top surface of the bridge structure 110 may be above the top surface of the redistribution layer 108, and the sidewall of the bridge structure 110 may be partially covered by the redistribution layer 108 in some other embodiments.

As shown in FIG. 1, a first semiconductor component 112a and a second semiconductor component 112b are bonded onto the redistribution layer 108 through a plurality of conductive structures 114, in accordance with some embodiments. In some embodiments, the conductive structures 114 include conductive materials, such as metal. The conductive structures 114 may include microbumps, controlled collapse chip connection (C4) bumps, ball grid array (BGA) balls, the like, or a combination thereof.

As shown in FIG. 1, the conductive structures 114 may include a first conductive structure 114a and a second conductive structure 114b, wherein the first conductive structure 114a may be in contact with the top surface of the bridge structure 110, and the second conductive structure 114b may be in contact with the redistribution layer 108. In some embodiments, one dimension (e.g. the diameter) of the second conductive structure 114b is greater than the dimension (e.g. the diameter) of the first conductive structure 114a. It should be noted that the configuration of the conductive structures 114 shown in the figures is exemplary only and is not intended to limit the present disclosure.

The conductive structures 114 may be surrounded by an underfill material 115. In some embodiments, the underfill material 115 is between the redistribution layer 108 and the first semiconductor component 112a and the second semiconductor component 112b, and fills in gaps between the conductive structures 114 to provide structural support. As shown in FIG. 1, the sidewall of the underfill material 115 may be substantially coplanar with the sidewall of the redistribution layer 108.

In some embodiments, the underfill material 115 may be dispensed with capillary force after the conductive structures 114 are formed between the redistribution layer 108 and the first semiconductor component 112a and the second semiconductor component 112b. Then, the underfill material 115 may be cured using a suitable curing process, such as a thermal cure process, a ultra-violet (UV) cure process, or the like. The underfill material 115 may be formed of polymer, such as epoxy.

The first semiconductor component 112a and the second semiconductor component 112b may be formed on the redistribution layer 108 by a die-last approach. In particularly, the first semiconductor component 112a and the second semiconductor component 112b may be bonded onto the redistribution layer 108 after the formation of the redistribution layer 108. As a result, yield and reliability of the semiconductor package structure 100 can be improved.

In some embodiments, the first semiconductor component 112a and the second semiconductor component 112b are active devices. For example, the first semiconductor component 112a and the second semiconductor component 112b may each independently include a system-on-chip (SoC) die, a logic device, a memory device, a radio frequency (RF) device, the like, or any combination thereof. For example, the first semiconductor component 112a and the second semiconductor component 112b may each independently include a microcontroller (MCU), a microprocessor (MPU), a power management integrated circuit (PMIC), a global positioning system (GPS) device, a central processing unit (CPU), a graphics processing unit (GPU), a dynamic random access memory (DRAM) controller, a static random-access memory (SRAM), a high bandwidth memory (HBM), the like, or any combination thereof. In some other embodiments, the first semiconductor component 112a and/or the second semiconductor component 112b include passive devices, such as resistors, capacitors, inductors, the like, or a combination thereof. The first semiconductor component 112a and the second semiconductor component 112b may include the same or different devices. For example, the first semiconductor component 112a is a SoC device, and the second semiconductor component 112b is an HBM. Alternatively, for example, the first semiconductor component 112a and the second semiconductor component 112b are SOC devices. In some embodiment, the first semiconductor component 112a and the second semiconductor component 112b may be manufactured following the same process node, for example, following 7 nm node; In some other embodiment, the first semiconductor component 112a and the second semiconductor component 112b may be manufactured following different process nodes, for example, the first semiconductor component 112a may be manufactured following 7 nm node, and the second semiconductor component 112b may be manufactured following 6 nm node, but not limited.

In some other embodiments, one or more passive devices are also bonded onto the redistribution layer 108, such as resistors, capacitors, inductors, the like, or a combination thereof. Although two semiconductor components, the first semiconductor component 112a and the second semiconductor component 112b, are shown in FIG. 1, the number of semiconductor components may be more than two.

In some embodiments, the first semiconductor component 112a is electrically coupled to the second semiconductor component 112b through the redistribution layer 108 and the bridge structure 110. The first semiconductor component 112a and the second semiconductor component 112b may be electrically coupled to the wiring structure of the substrate 102 through the conductive structures 114, the redistribution layer 108, the bridge structure 110, and the conductive structures 104.

As shown in FIG. 1, the bridge structure 110 partially overlaps with the first semiconductor component 112a and the second semiconductor component 112b in a direction which is substantially perpendicular to the top surface of the substrate 102, in accordance with some embodiments. The interconnection between components which have a high Input/Output (I/O) density or components for high-speed communication can thereby be achieved.

The bridge structure 110, the first semiconductor component 112a, and the second semiconductor component 112b may include the same type of components or different types of components. The dimension (e.g. the width) of the bridge structure 110 may be substantially less than, equal to, or greater than the dimension (e.g. the width) of the first semiconductor component 112a or the dimension (e.g. the width) of the second semiconductor component 112b.

In some embodiments, the first semiconductor component 112a and the second semiconductor component 112b are surrounded by a molding material 116. The molding material 116 may prevent the first semiconductor component 112a and the second semiconductor component 112b from damage due to, for example, the stress, the chemicals and/or the moisture. The molding material 116 may fill in gaps between the first semiconductor component 112a and the second semiconductor component 112b. The molding material 116 may adjoin the sidewalls of the first semiconductor component 112a and the second semiconductor component 112b.

In some embodiments, the molding material 116 includes a nonconductive material, such as a moldable polymer, an epoxy, a resin, the like, or a combination thereof. In some embodiments, the molding material 116 is applied in liquid or semi-liquid form, and then is cured using a suitable curing process, such as a thermal curing process, a UV curing process, the like, or a combination thereof. The molding material 116 may be shaped or molded with a mold (not shown).

Then, the molding material 116 may be partially removed by a planarization process, such as chemical mechanical polishing (CMP), until the top surface of the first semiconductor component 112a or the top surface of the second semiconductor component 112b is exposed. Alternatively, both of the top surface of the first semiconductor component 112a and the top surface of the second semiconductor component 112b may be exposed or may be covered by the molding material 116.

The sidewall of the molding material 116 may be substantially coplanar with the sidewall of the underfill material 115 and may be substantially coplanar with the sidewall of the redistribution layer 108. The first semiconductor component 112a and the second semiconductor component 112b are surrounded by the molding material 116 as shown in FIG. 1, but the present disclosure is not limit thereto. For example, the first semiconductor component 112a and the second semiconductor component 112b may be surrounded by two molding materials.

As mentioned previously, the semiconductor package structure 100 may include more than two semiconductor components. In these embodiments, more than two semiconductor components are surrounded by the molding material 116. Alternatively, more than one molding material may be used for these semiconductor components.

In some embodiments, a plurality of conductive terminals 118 are formed below the substrate 102, and electrically coupled to the wiring structure of the substrate 102. The conductive terminals 118 may include conductive materials, such as metal. The conductive terminals 118 may include microbumps, controlled collapse chip connection (C4) bumps, ball grid array (BGA) balls, the like, or a combination thereof.

In the above embodiment, the bridge structure 110 which includes an active device is formed in the redistribution layer 108 to provide an interconnection between the first semiconductor component 112a and the second semiconductor component 112b, an interconnection between the first semiconductor component 112a and the bridge structure 110, and an interconnection between the second semiconductor component 112b and the bridge structure 110. As a result, the interconnection between components which have a high I/O density or components for high-speed communication can be achieved. The signal path can also be minimized by the bridge structure 110 to increase the processing speed, and low power and low latency can be provided.

Moreover, in comparison with providing a substrate which has a bridge structure, forming the bridge structure 110 in the redistribution layer 108 can reduce the layer count of the substrate, and thus simplify the manufacturing process of the substrate 102. Therefore, the fabrication yield of the semiconductor package structure 100 can be improved, and the cost of the semiconductor package structure 100 can be lowered.

Furthermore, since the formation of substrates 102 without a bridge structure 110 is well-developed, flexible processes may be used to form the semiconductor package structure 100. In addition, the bridge structure 110 and the redistribution layer 108 may have different L/S, and thus a flexible routing for high-end devices and multi-function integration can be provided. Since the bridge structure 110 can achieve a finer L/S than the redistribution layer, the L/S of the redistribution layer no longer acts as a bottleneck in semiconductor package development.

FIG. 2 is a cross-sectional view of a semiconductor package structure 200, in accordance with some other embodiments of the present disclosure. It should be noted that the semiconductor package structure 200 may include the same or similar components as that of the semiconductor package structure 100 shown in FIG. 1, and for the sake of simplicity, those components will not be discussed in detail again. In the following embodiments, the bridge structure has a plurality of through vias for dual-side joint. That is, both of the upper side and the lower side of the bridge structure can be used for interconnection.

As shown in FIG. 2, the bridge structure 110 may have a plurality of through vias 120, which are electrically coupled to the redistribution layer 108 and the conductive structures 114. The first semiconductor component 112a and the second semiconductor component 112b may be electrically coupled to the through vias 120 through the conductive structures 114. The first semiconductor component 112a and the second semiconductor component 112b may be electrically coupled to the wiring structure of the substrate 102 through the conductive structures 114, the redistribution layer 108, the bridge structure 110, the through vias 120, and the conductive structures 104.

The through vias 120 may be formed of any conductive material, such as a metal. For example, the through vias 120 may be formed of copper. The through vias 120 may extend from the top surface of the bridge structure 110 to the bottom surface of the bridge structure 110, but the present disclosure is not limit thereto. The interconnecting structure, which includes the through vias 120, in the bridge structure 110 may have other configurations.

The through vias 120 may have a different L/S than the redistribution layer 108. For example, the through vias 120 may have a finer L/S than an L/S of the redistribution layer 108. A flexible routing for high-end devices and multi-function integration can thereby be achieved. The positions and the numbers of the through vias 120 may be adjusted according to the routing of the semiconductor package structure 200.

FIG. 3 is a cross-sectional view of a semiconductor package structure 300, in accordance with some other embodiments of the present disclosure. It should be noted that the semiconductor package structure 300 may include the same or similar components as that of the semiconductor package structure 100 shown in FIG. 1, and for the sake of simplicity, those components will not be discussed in detail again. In comparison with the embodiment of FIGS. 1 and 2 where the semiconductor component is electrically coupled to the bridge structure through conductive structures, the semiconductor component is electrically coupled to the bridge structure through the redistribution layer in the following embodiments. As a result, the I/O density can be increased.

As shown in FIG. 3, the semiconductor package structure 300 includes a redistribution layer 302 with a bridge structure 110 embedded therein, in accordance with some embodiments. The redistribution layer 302 may be similar to the redistribution layer 108 as shown in FIG. 1, and will not be repeated. The top surface of the bridge structure 110 may be covered by the redistribution layer 302.

A first semiconductor component 112a and a second semiconductor component 112b are on the redistribution layer 302 and in contact with the redistribution layer 302, in accordance with some embodiments. The first semiconductor component 112a may be electrically coupled to the second semiconductor component 112b through the redistribution layer 302 and the bridge structure 110. The first semiconductor component 112a and the second semiconductor component 112b may be electrically coupled to the wiring structure of the substrate 102 through the redistribution layer 302, the bridge structure 110, and the conductive structures 104.

The first semiconductor component 112a and the second semiconductor component 112b may be surrounded by a molding material 116. The molding material 116 may be in contact with the top surface of the redistribution layer 302. The sidewall of the molding material 116 may be substantially coplanar with the sidewall of the redistribution layer 302.

The first semiconductor component 112a and the second semiconductor component 112b may be formed on the redistribution layer 302 by a die-first approach. In particularly, the redistribution layer 302 may be formed on the first semiconductor component 112a and the second semiconductor component 112b after the first semiconductor component 112a and the second semiconductor component 112b are surrounded by the molding material 116. As a result, the manufacturing process can be simplified.

FIG. 4 is a cross-sectional view of a semiconductor package structure 400, in accordance with some other embodiments of the present disclosure. It should be noted that the semiconductor package structure 400 may include the same or similar components as that of the semiconductor package structure 300 shown in FIG. 3, and for the sake of simplicity, those components will not be discussed in detail again. In the following embodiments, the bridge structure has a plurality of through vias for dual-side joint. That is, both of the upper side and the lower side of the bridge structure can be used for interconnection.

As shown in FIG. 4, the bridge structure 110 has a plurality of through vias 402, which are electrically coupled to different layers of the redistribution layer 302, in accordance with some embodiments. The first semiconductor component 112a and the second semiconductor component 112b may be electrically coupled to the through vias 402 through a portion of the redistribution layer 302, which is above the bridge structure 110. The first semiconductor component 112a and the second semiconductor component 112b may be electrically coupled to the wiring structure of the substrate 102 through the redistribution layer 302, the bridge structure 110, the through vias 402, and the conductive structures 104.

The through vias 402 in bridge structures 110 may be similar to the bridge structure 120 in the bridge structure 110 as shown in FIG. 2, and will not be repeated. The through vias 402 may have a different L/S than the redistribution layer 302. For example, the through vias 402 may have a finer L/S than an L/S of the redistribution layer 302. A flexible routing for high-end devices and multi-function integration can thereby be achieved. The positions and the numbers of the through vias 402 may be adjusted according to the routing of the semiconductor package structure 400.

FIG. 5 is a cross-sectional view of a semiconductor package structure 500, in accordance with some other embodiments of the present disclosure. It should be noted that the semiconductor package structure 500 may include the same or similar components as that of the semiconductor package structure 300 shown in FIG. 3, and for the sake of simplicity, those components will not be discussed in detail again.

In comparison with the embodiment of FIGS. 1 and 2 where the semiconductor component is electrically coupled to the bridge structure through conductive structures, the semiconductor component is electrically coupled to the bridge structure through the redistribution layer in the following embodiments. In comparison with the embodiment of FIGS. 3 and 4 where the bridge structure is embedded in a redistribution layer, the bridge structure is embedded in a molding material in the following embodiments. As a result, the I/O density can be increased. The layer count of the redistribution layer can be reduced as well.

As shown in FIG. 5, the semiconductor package structure 500 includes a first redistribution layer 502 over the substrate 102 and a second redistribution layer 504 over the first redistribution layer 502, in accordance with some embodiments. A bridge structure 110 may be between the first redistribution layer 502 and the second redistribution layer 504. In particular, the bottom surface of the bridge structure 110 may be covered by the first redistribution layer 502, and the top surface of the bridge structure 110 may be covered by the second redistribution layer 504.

The first redistribution layer 502 and the second redistribution layer 504 may be similar to the redistribution layer 108 as shown in FIG. 1, and will not be repeated. The configurations of the first redistribution layer 502 and the second redistribution layer 504 may be the same or different. For example, the layer count of the first redistribution layer 502 may be less than the layer count of the second redistribution layer 504.

The bridge structure 110 may have a different L/S than that of the first redistribution layer 502 and that of the second redistribution layer 504. The first redistribution layer 502 may have a different L/S than that of the second redistribution layer 504. For example, the L/S of the bridge structure 110 may be finer than the L/S of the first redistribution layer 502, and the L/S of the first redistribution layer 502 may be finer than the L/S of the second redistribution layer 504. A flexible routing for high-end devices and multi-function integration can thereby be achieved. For example, the L/S of the bridge structure 110 may be equal to or less than about 2/2 μm, such as range from about 0.4/0.4 μm to about 2/2 μm. For example, the L/S of the first redistribution layer 502 may be equal to or greater than about 2/2 μm, such as range from about 2/2 μm to about 10/10 μm. For example, the L/S of the second redistribution layer 504 may be equal to or greater than about 2/2 μm, such as range from about 2/2 μm to about 10/10 μm. For example, the L/S of the first redistribution layer 502 may be about 5/5 μm, and the L/S of the second redistribution layer 504 may be about 2/2 μm.

In addition, the layer of the first redistribution layer 502 which is close to the bridge structure 110 may have a finer L/S than that of the layer the first redistribution layer 502 which is far to the bridge structure 110. The layer of the second redistribution layer 504 which is close to the bridge structure 110 may have a finer L/S than that of the layer the second redistribution layer 504 which is far to the bridge structure 110.

It should be noted that the configuration of the bridge structures 110 shown in the figures is exemplary only. The semiconductor package structure 500 may include more than one bridge structure 110. For example, the semiconductor package structure 500 may include two bridge structures 110, wherein one of the bridge structures 110 is between the first redistribution layer 502 and the second redistribution layer 504, and the other one of the bridge structures 110 is embedded in the first redistribution layer 502.

In some embodiments, a plurality of conductive pillars 506 are adjacent to the bridge structure 110 and between the first redistribution layer 502 and the second redistribution layer 504. The conductive pillars 506 may be electrically coupled to the first redistribution layer 502 and the second redistribution layer 504. In some embodiments, the conductive pillars 506 include metal pillars, such as copper pillars. The conductive pillars 506 may be formed by a plating process or any other suitable process.

The configuration of the conductive pillars 506 shown in the figures is exemplary only and is not intended to limit the present disclosure. The conductive pillars 506 may have substantially vertical sidewalls. The height of the conductive pillars 506 is substantially equal to or greater than the height of the bridge structure 110. Each of the conductive pillars 506 may be a different shape.

As shown in FIG. 5, the bridge structure 110 is on the center of the top surface of the first redistribution layer 502, and the numbers of the conductive pillars 506 are equivalent on opposite sides of the bridge structure 110, but the present disclosure is not limit thereto. For example, the numbers of the conductive pillars 506 may be different on opposite sides of the bridge structure 110.

A molding material 510 may be between the first redistribution layer 502 and the second redistribution layer 504. The bridge structure 110 and the conductive pillars 506 may be surrounded by a molding material 510. The molding material 510 may prevent the bridge structure 110 and the conductive pillars 506 from damage due to, for example, the stress, the chemicals and/or the moisture.

In some embodiments, the molding material 510 includes a nonconductive material, such as a moldable polymer, an epoxy, a resin, the like, or a combination thereof. In some embodiments, the molding material 510 is applied in liquid or semi-liquid form, and then is cured using a suitable curing process, such as a thermal curing process, a UV curing process, the like, or a combination thereof. The molding material 510 may be shaped or molded with a mold (not shown).

The molding material 510 may fill in gaps between the bridge structure 110 and the conductive pillars 506. The molding material 510 may adjoin the sidewalls of the bridge structure 110 and the conductive pillars 506. The sidewall of the molding material 510 may be substantially coplanar with the sidewall of the underfill material 115 and may be substantially coplanar with the sidewall of the first redistribution layer 502 and the sidewall of the second redistribution layer 504.

In some embodiments, a plurality of conductive connectors 508 are on the top surface of the bridge structure 110. The conductive connectors 508 may be between the bridge structure 110 and the second redistribution layer 504, and may electrically couple the bridge structure 110 to the second redistribution layer 504. The molding material 510 may surround the conductive connectors 508 and it may cover the top surface of the bridge structure 110.

In some embodiments, the conductive connectors 508 include metal, such as copper. The conductive connectors 508 may be formed by a plating process or any other suitable process. The conductive connectors 508 and the conductive pillars 506 may be formed in the same process, and include the same material. In some other embodiments, the conductive connectors 508 and the conductive pillars 506 may be formed in the different processes, and include the different materials. The height of the conductive pillars 506 is substantially equal to the total height of the bridge structure 110 and the conductive connectors 508.

The conductive connectors 508 are optional. In some embodiments, no conductive connectors 508 are disposed, and the second redistribution layer 504 is in contact with the bridge structure 110. The molding material 510 may surround the bridge structure 110, and it may not cover the top surface of the bridge structure 110. In these embodiments, the height of the conductive pillars 506 is substantially equal to the height of the bridge structure 110.

A first semiconductor component 112a and a second semiconductor component 112b are on the second redistribution layer 504 and in contact with the second redistribution layer 504, in accordance with some embodiments. The first semiconductor component 112a may be electrically coupled to the second semiconductor component 112b through the second redistribution layer 504 and the bridge structure 110. The first semiconductor component 112a and the second semiconductor component 112b may be electrically coupled to the wiring structure of the substrate 102 through the second redistribution layer 504, the bridge structure 110, the conductive pillars 506, the first redistribution layer 502, and the conductive structures 104, and further through the conductive connectors 508 if the conductive connectors 508 are disposed.

The first semiconductor component 112a and the second semiconductor component 112b may be surrounded by a molding material 116. The molding material 116 may be in contact with the top surface of the second redistribution layer 504. As shown in FIG. 5, the sidewall of the molding material 116, the sidewall of the second redistribution layer 504, the sidewall of the molding material 510, and the sidewall of the first redistribution layer 502 are substantially coplanar, but the present disclosure is not limit thereto. For example, the sidewall of the molding material 116, the sidewall of the second redistribution layer 504 may be substantially coplanar, and may not be coplanar with the sidewall of the molding material 510 in some other embodiments.

The first semiconductor component 112a and the second semiconductor component 112b may be formed on the second redistribution layer 504 by a die-first approach. In particularly, the second redistribution layer 504 may be formed on the first semiconductor component 112a and the second semiconductor component 112b after the first semiconductor component 112a and the second semiconductor component 112b are surrounded by the molding material 116. As a result, the manufacturing process can be simplified.

FIG. 6 is a cross-sectional view of a semiconductor package structure 600, in accordance with some other embodiments of the present disclosure. It should be noted that the semiconductor package structure 600 may include the same or similar components as that of the semiconductor package structure 500 shown in FIG. 5, and for the sake of simplicity, those components will not be discussed in detail again. In the following embodiments, the bridge structure has a plurality of through vias for dual-side joint. That is, both of the upper side and the lower side of the bridge structure can be used for interconnection.

As shown in FIG. 6, the bridge structure 110 has a plurality of through vias 602, which are electrically coupled to the first redistribution layer 502 and the second redistribution layer 504. The through vias 602 may be electrically coupled to the second redistribution layer 504 through the conductive connectors 508 if the conductive connectors 508 are disposed. The first semiconductor component 112a and the second semiconductor component 112b may be electrically coupled to the through vias 602 through the second redistribution layer 504. The first semiconductor component 112a and the second semiconductor component 112b may be electrically coupled to the wiring structure of the substrate 102 through the first redistribution layer 502, the bridge structure 110, the through vias 602, the conductive pillars 506, the second redistribution layer 504, and the conductive structures 104, and further through the conductive connectors 508 if the conductive connectors 508 are disposed.

The through vias 602 in bridge structures 110 may be similar to the bridge structure 120 in the bridge structure 110 as shown in FIG. 2, and will not be repeated. The through vias 602 may have a different L/S than the first redistribution layer 502 and the second redistribution layer 504. For example, the through vias 602 may have a finer L/S than an L/S of the first redistribution layer 502 and an L/S of the second redistribution layer 504. A flexible routing for high-end devices and multi-function integration can thereby be achieved. The positions and the numbers of the through vias 602 may be adjusted according to the routing of the semiconductor package structure 600.

In summary, the present disclosure provides one or more bridge structures which include an active device over a substrate to provide an interconnection between semiconductor components and to provide an interconnection between the semiconductor component and the bridge structures. As a result, the interconnection between components which have a high I/O density or components for high-speed communication can be achieved. The signal path can also be minimized by the bridge structure to increase the processing speed. Low power and low latency can be achieved as well.

Furthermore, compared to substrates with integral bridge structures, the manufacturing of substrates without a bridge structure is well-developed. Therefore, flexible processes may be used to form the semiconductor package structure. The layer count of the redistribution layer can also be reduced. Moreover, the layer count of the substrate can also be reduced, and the manufacturing process of the substrate can be simplified. Therefore, the fabrication yield of the semiconductor package structure can be improved, and the cost of the semiconductor package structure can be lowered.

According to some embodiments, the line width/space of the interconnecting structure in the bridge structure is different than that of other components, such as the redistribution layer, thereby providing a flexible routing for high-end devices and multi-function integration. Since the bridge structure can achieve a finer L/S, the L/S of the redistribution layer no longer acts as a bottleneck in semiconductor package development. The interconnection between components which have a high I/O density or components for high-speed communication can be achieved.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
a substrate;
a first redistribution layer over the substrate;
a second redistribution layer over the first redistribution layer;
a bridge structure in the first redistribution layer and covered by the second redistribution layer, wherein the bridge structure includes an active device;
a first semiconductor component and a second semiconductor component over the second redistribution layer, wherein the first semiconductor component is electrically coupled to the second semiconductor component through the second redistribution layer and the bridge structure.

2. The semiconductor package structure as claimed in claim 1, wherein the bridge structure partially overlaps with the first semiconductor component and the second semiconductor component when viewed in a direction that is substantially perpendicular to a top surface of the substrate.

3. The semiconductor package structure as claimed in claim 1, wherein the first semiconductor component and the second semiconductor component are surrounded by a molding material, and a sidewall of the molding material is substantially coplanar with a sidewall of the second redistribution layer.

4. The semiconductor package structure as claimed in claim 1, wherein the bridge structure has a plurality of through vias, and the plurality of through vias are electrically coupled to the second redistribution layer.

5. The semiconductor package structure as claimed in claim 1, wherein the first redistribution layer is in contact with the second redistribution layer.

6. The semiconductor package structure as claimed in claim 1, wherein a bottom surface of the bridge structure is above a bottom surface of the first redistribution layer.

7. The semiconductor package structure as claimed in claim 3, wherein a sidewall of the first redistribution layer is substantially coplanar with the sidewall of the second redistribution layer.

8. The semiconductor package structure as claimed in claim 3, wherein a top surface of the second redistribution layer is covered by the molding material.

9. The semiconductor package structure as claimed in claim 4, wherein the plurality of through vias have a finer line width and space than a line width and space of the first redistribution layer.

10. A semiconductor package structure, comprising:
a substrate;
a redistribution layer over the substrate;
a bridge structure in the redistribution layer and including an active device, wherein the bridge structure has a plurality of through vias which are electrically coupled to the redistribution layer; and
a first semiconductor component and a second semiconductor component over the redistribution layer, wherein the first semiconductor component is electrically coupled to the second semiconductor component through the redistribution layer and the bridge structure.

11. The semiconductor package structure as claimed in claim 10, wherein the first semiconductor component and the second semiconductor component are surrounded by a molding material.

12. The semiconductor package structure as claimed in claim 10, wherein the top surface of the bridge structure is exposed by the redistribution layer.

13. The semiconductor package structure as claimed in claim 10, wherein the redistribution layer covers the top surface of the bridge structure.

14. The semiconductor package structure as claimed in claim 10, further comprising a plurality of conductive structures between the first semiconductor component and the redistribution layer, wherein the plurality of conductive structures are surrounded by an underfill material.

15. The semiconductor package structure as claimed in claim 10, wherein the plurality of through vias have a finer line width and space than a line width and space of the redistribution layer.

16. The semiconductor package structure as claimed in claim 10, further comprising:
   a plurality of conductive structures between the redistribution layer and the substrate, wherein the plurality of conductive structures are electrically coupled to the redistribution layer and a wiring structure of the substrate; and
   a plurality of conductive terminals below the substrate, wherein the plurality of conductive terminals are electrically coupled to the wiring structure of the substrate.

17. A semiconductor package structure, comprising:
   a substrate;
   a redistribution layer over the substrate;
   a bridge structure in the redistribution layer and including an active device;
   a plurality of conductive structures over the redistribution layer; and
   a first semiconductor component and a second semiconductor component over the plurality of conductive structures, wherein the first semiconductor component is electrically coupled to the second semiconductor component through the plurality of conductive structures, the redistribution layer and the bridge structure.

18. The semiconductor package structure as claimed in claim 17, wherein the bridge structure has a finer line width and space than the line width and space of the redistribution layer.

19. The semiconductor package structure as claimed in claim 17, wherein the plurality of conductive structures comprise:
   a first conductive structure in contact with the top surface of the bridge structure; and
   a second conductive structure in contact with the redistribution layer, wherein a dimension of the second conductive structure is greater than a dimension of the first conductive structure.

20. The semiconductor package structure as claimed in claim 19, wherein the bridge structure has a plurality of through vias, and the first conductive structure is electrically coupled to the redistribution layer through the plurality of through vias.

* * * * *